United States Patent [19]

Strong

[11] 4,217,543
[45] Aug. 12, 1980

[54] DIGITAL CONDUCTANCE METER
[75] Inventor: Norman H. Strong, Seattle, Wash.
[73] Assignee: John Fluke Mfg. Co., Inc., Mountlake Terrace, Wash.
[21] Appl. No.: 946,069
[22] Filed: Sep. 27, 1978

Related U.S. Application Data

[63] Continuation of Ser. No. 799,693, May 23, 1977, abandoned.
[51] Int. Cl.$^2$ .................... G01R 27/02; H03K 13/02
[52] U.S. Cl. ............................... 324/62; 340/347 NT
[58] Field of Search ............................ 324/62, 99 D; 340/347 NT; 364/829, 830, 733

[56] References Cited
U.S. PATENT DOCUMENTS

| | | | |
|---|---|---|---|
| 3,368,149 | 2/1968 | Wasserman | 324/99 D |
| 3,749,894 | 7/1973 | Avdeef | 340/347 NT |
| 3,875,503 | 4/1975 | Hayashi | 324/62 |
| 3,876,933 | 4/1975 | Herrington | 324/62 |

*Primary Examiner*—Ernest F. Karlsen
*Attorney, Agent, or Firm*—Christensen, O'Connor, Johnson & Kindness

[57] ABSTRACT

Determining the value of resistance directly, but inversely, based on conductance measurements, rather than directly, based on resistance measurements, is disclosed. A voltage drop of one polarity across a referenced resistance controls the charge rate of the capacitor of an integrator of a dual slope analog-to-digital converter for a known period of time. Thereafter the capacitor is discharged to a predetermined level (e.g., zero) for a measured period of time at a rate determined by a voltage drop of opposite polarity across an unknown resistance. The measured period of time is directly related to the conductance value of the unknown resistance and inversely related to the resistance value. The time measurement is stored in latches, which control a digital display.

11 Claims, 3 Drawing Figures

DIGITAL CONDUCTANCE METER

This is a continuation of application Ser. No. 799,693, filed May 23, 1977, now abandoned.

BACKGROUND OF THE INVENTION

This invention is directed to devices for determining resistance values, and, more particularly to devices for determining resistance values in the tens of megohm range and above (generally above 20 megohms).

In the past, many digital ohmmeters have been limited to directly measuring resistance values up to 20 megohms. Values above 20 megohms usually have been determined by measuring the combined resistance of a low resistor of known value connected in parallel with the high resistance of unknown value. Then a calculation is made, based on the measurement and the value of the known resistance, to determine the value of the unknown resistance. This procedure, while useful, is somewhat unsatisfactory. First, it is time consuming and subject to calculation error. In this regard, this technique only works well with resistances that are very high relative to the value of the known resistance. If the known resistance is not substantially lower than the value of the unknown resistance, the mathematical calculations become quite complicated. The present invention is directed to solving this problem and providing a device suitable for accurately, directly measuring resistance values above 20 megohms.

Prior attempts to solve this problem, i.e., to provide a device for directly measuring resistance values above 20 megohms, have usually involved adding an extended scale of one decade. This solution is generally unsatisfactory because the extended range has a very slow response time. Further, this solution only postpones the problem for one decade, i.e., resistance values above the extended range (200 megohms) still cannot be directly measured. Another approach has been to place an external power supply in series with the unknown resistance and a digital volt meter. This approach requires knowledge of the internal resistance of the volt meter, as well as knowledge of the exact value of the external voltage. In addition to being cumbersome, this technique is somewhat expensive to implement.

Therefore it is an object of this invention to provide a new and improved method of, and apparatus for, measuring resistance values in the tens of megohm range and above.

It is another object of this invention to provide an inexpensive and uncomplicated apparatus for determining resistance values in the tens of megohm range and above.

it is a still further object of this invention to provide an apparatus that provides an accurate, direct measurement of resistance values in the tens of megohm range and above.

SUMMARY OF THE INVENTION

In accordance with this invention, resistance values are determined directly, but inversely, by measuring the conductance value, rather than resistace value of an unknown resistance. In accordance with the present invention, the voltage drop across a referenced resistance is used to control the charge rate of the capacitor of an integrator, which may form a portion of a dual slope analog-to-digital (A/D) converter. Preferably, the capacitor is charged for a known period of time. Thereafter, the capacitor is discharged to a predetermined level at a rate related to a voltage drop of opposite polarity taken across an unknown resistance for a measured period of time. The time measurement is directly related to the conductance value of the unknown resistance and, inversely related to the resistance value. The resultant time measurement is used to control a digital display.

The preferred form of an apparatus formed in accordance with the invention includes a controller for controlling the application of the voltages controlling the charging and discharging of the capacitor of the integrator. The controller first causes a voltage related to the voltage drop across the referenced resistor to be applied to the integrator until a counter starting at a fixed value (e.g., zero) overflows. When the counter overflows, the controller causes the voltage drop across the unknown resistance to be applied to the integrator. When the output of the integrator reaches a predetermined level (e.g., zero) the output of the counter is transferred to storage latches. The count output, of course, is related to the ratio between the measured time period and the known time period (determined by when the counter overflow occurs). The measured value is directly related to the conductance value. It is integrally related if the known period is appropriately chosen, i.e., chosen to be 100 ms, for example. The output of the latches is applied to a suitable display.

As will be appreciated by those skilled in the art and others, the present invention operates in a manner directly opposite to the normal operation of a digital ohmmeter. That is, in a digital ohmmeter, normally, the capacitor of the integrator is charged in accordance with the voltage drop across the unknown resistance and discharged in accordance with the voltage drop across a referenced resistance. When the voltage drop reaches a predetermined level, the output of a counter is transferred to data latches that control a display. The output, contrary to the present invention, is related to resistance, i.e., the measured time period, which is the ratio of a known value to an unknown value, is directly equatable to resistance. As noted above, this approach has a number of disadvantages when the value of the resistance being measured is in the tens of megohm range and above. The present invention, however, is not so limited. Because the invention uses the same apparatus of a digital ohmmeter used to measure resistance, albeit in a different manner, it is inexpensive to produce. Moreover, because the invention is direct reading, it eliminates any need for mathematical computations to be performed unless it is desired to convert a readout in terms of conductance into resistance. If so, a simple division problem is presented. In this regard, the readout can be in the form of resistance, if desired, by merely inverting the time measurement and using the inverted value to control the readout display.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
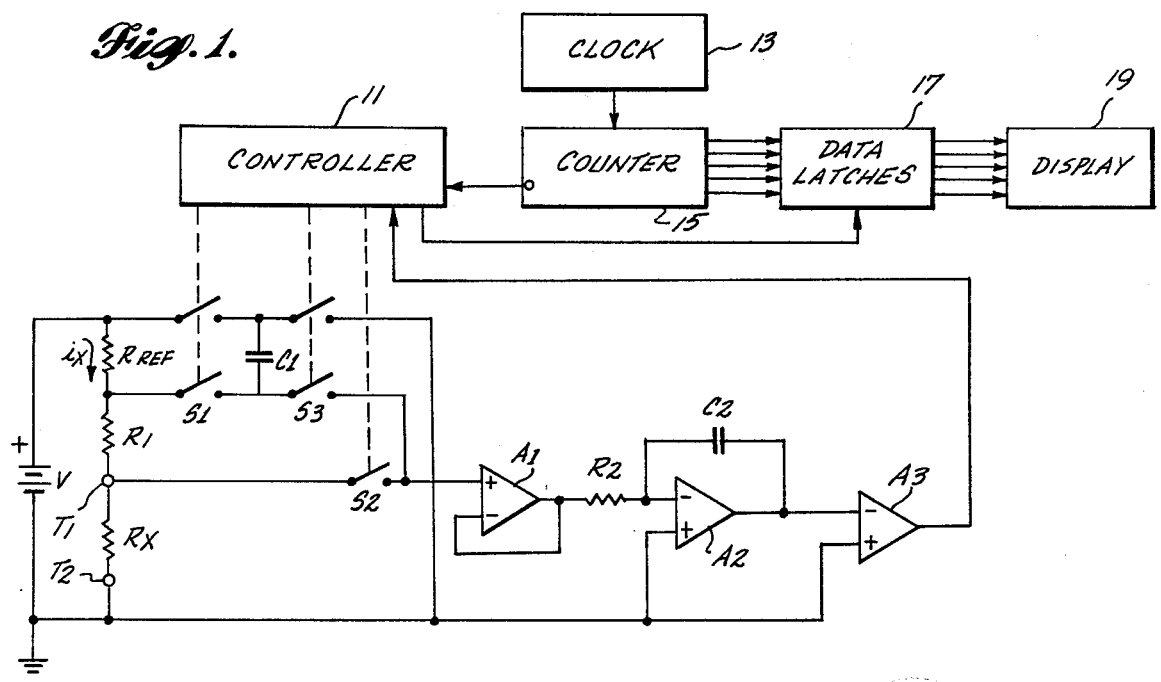
FIG. 1 is a partially block and partially schematic diagram of a preferred embodiment of the invention.

FIG. 1 is a partially block and partially schematic diagram of a preferred embodiment of a digital conductance meter formed in accordance with the invention and comprises: a voltage source designated V; a referenced resistor designated $R_{ref}$; two resistors designated R1 and R2; two capacitors designated C1 and C2; a first double pole, single throw switch designated S1; a single pole, single throw switch designated S2; a second double pole, single throw switch designated S3; two operational amplifiers designated A1 and A2; a comparator designated A3; a controller 11; a clock 13; a counter 15; data latches 17; and, a display 19. FIG. 1 also illustrates an unknown resistance designated $R_x$ connected across a pair of input terminals designated T1 and T2.

The negative terminal of V is connected to ground and to T2. The positive terminal of V is connected through $R_{ref}$ and R1, connected in series, to T1. The terminals of one side of S1 are connected to the opposite ends of $R_{ref}$, and terminals of the other side of S1 are connected to the opposite ends of C1. Hence, when S1 is closed, C1 is connected in parallel with $R_{ref}$. The terminals of one side of S3 are connected to the opposite ends of C1. The other terminal of the portion of S3 connected to the positive end of C1, i.e., the end connectable by S1 to the positive side of V, is connected to ground. The other terminal of the portion of S3 connected to the negative end of C1, i.e., the end connectable by S1 to the junction between $R_{ref}$ and R1, is connected to the noninverting input of A1.

T1 is connected through S2 to the noninverting input of A1. The output of A1 is connected to the inverting input of A1. The output of A1 is also connected through R2 to the inverting input of A2. The noninverting input of A2 is connected to ground. C2 is connected between the output of A2 and the inverting input of A2. The output of A2 is also connected to the inverting input of A3. The noninverting input of A3 is connected to ground. The output of A3 is connected to the controller 11.

As illustrated by dashed lines, the controller 11 is connected to control the opening and closing of S1, S2 and S3. In this regard, as will be readily appreciated by those skilled in the art, while S1, S2 and S3 are illustrated as conventional switches, in an actual embodiment of the invention, these switches would take the form of semiconductor switches controlled by the controller 11.

The counter 15 is connected to the clock 13 to receive clock pulses therefrom. The overflow output of the counter 15, designated 0, is applied to a control input of the controller 11. The outputs of the various stages of the counter 15 are connected to the data inputs of the data latches 17. The enable input of the data latches 17 are connected to an enable output of the controller 11. The data outputs of the data latches 17 are connected to the display control inputs of the display 19.

In essense, the system illustrated in FIG. 1 breaks down into four major subsystems: (1) an input circuit comprising V, $R_{ref}$,R1,C1,S1,S2 and S3; (2) a dual slope analog-to-digital (A/D) converter subsystem comprising A1, A2, A3, R2 and C2; (3) a control subsystem comprising the controller 11, the clock 13, the counter 15; and, (4) a display subsystem comprising the data latches 17 and the display 19.

As will be readily appreciated by those skilled in the resistance measuring art, in the past, dual-slope A/D converters have been used in a ratio manner to measure resistance. In this regard, a voltage of unknown magnitude related to a voltage drop across an unknown resistance has been applied to an integrator (e.g., A2, R2 and C2) for a known predetermined time period. Thereafter a voltage drop of opposite polarity, but known magnitude, has been applied to the integrator for the time period required to bring the output of the integrator back to its starting voltage as determined by the output of the comparator. The resultant time period is directly related to the value of the unknown resistance, and this value has been used to control a direct reading display. The following equation is applicable to such resistance measuring devices:

$$\frac{V_x}{-V_{ref}} = \frac{t_{ref}}{t_x} \quad (1)$$

Where:
$V_x$ equals the voltage drop across the unknown resistance;
$V_{ref}$ is equal to the reference voltage;
$t_x$ is equal to the known integration time when $V_x$ is applied; and,
$t_{ref}$ is equal the unknown integration time when $V_{ref}$ is applied.

Since time is usually denoted as the number of cycles (N) of a constant frequency clock (f) counted during the measurement interval, $t_{ref}$ and $t_x$ can be replaced by $fN_x$ and $fN_{ref}$, respectively. After this replacement is made, the frequency value (f) can be cancelled out and equation (1) rewritten as:

$$V_x = \frac{V_{ref}}{N_x}(N_{ref}) \quad (2)$$

If $V_{ref}$ and $N_x$ are chosen properly (normally $N_x$ is chosen to equal some round figure, such as the overflow value of a counter), $V_x$ will read out directly as $N_{Ref}$. $V_x$ of course, is directly related to the value of the resistance.

While the invention contemplates using the system illustrated in FIG. 1 in a different manner, it can be utilized to perform resistance measurements in the manner generally discussed above. When used to measure resistance is such a manner, $C_1$ is charged through $S_1$ to $V_{ref}$ and $V_x$ is integrated through S2, both during the $N_x$ period of time. During the $N_{ref}$ period of time, the voltage on C1 is applied, in opposite polarity, to the input of the dual slope analog-to-digital converter, through S3. The applicable equation is:

$$\frac{V_x}{V_{ref}} = \frac{i_x R_x}{i_x R_{ref}} = \frac{N_{ref}}{N_x} \quad (3)$$

which can be rewritten as:

$$R_x = \frac{R_{ref}}{N_x} N_{ref} \quad (4)$$

Again, if $R_{ref}$ and $N_x$ are appropriately chosen, $N_{ref}$ is directly equatable to the resistance value of $R_x$.

Figure 2:
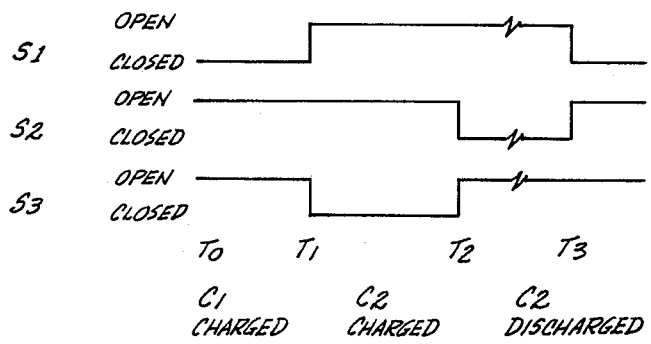
FIG. 2 is a timing diagram illustrating the opening and closing of certain switches illustrated in FIG. 1; and, FIG. 3 is a generalized wave form diagram illustrating the voltage on the output of the integrator of an analog-to-digital converter operated in accordance with the invention.

The present invention modifies the operation of the system illustrated in FIG. 1 such that conductance, rather than resistance is measured. This is accomplished by changing the order of switching times and adding a third period during which the dual slope analog-to-digital converter (which includes the integrator formed by A2, R2 and C2), is disconnected for a period of time while S1 is closed. FIG. 2 illustrates the sequence of operation.

From $T_0$ to $T_1$ S1 is closed while S2 and S3 are open. During this period of time C1 is charged. The time between $T_0$ and $T_1$ is adequate for the voltage on C1 to settle to a level equal to the voltage drop across $R_{ref}$.

Figure 3:
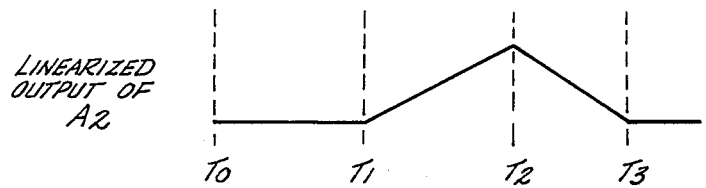

At $T_1$, S1 is open and S3 closed, S2 remaining open. As a result, the integrator of the dual slope analog-to-digital converter integrates at a rate related to the voltage stored by C1. The integration occurs between $T_1$ and $T_2$. This period of time is fixed and known, as hereinafter discussed. (In essence, during this period of time, C2 is charged.) At $T_2$, S3 opens and S2 closes, S1 remaining open. From $T_2$ to $T_3$ a voltage of opposite polarity is applied to the integrator, whereby C2, in essence, discharges. When the output of A3, which forms a comparator that compares the output of the integrator to ground, reaches zero (or some other predetermined level) counting terminates. This time period $N_x$ and is directly related to the conductance value of $R_x$ which, of course, is inversely related to the resistance value of $R_x$. FIG. 3 is a linearized diagram illustrating the voltage at the output of the integrator, i.e., the voltage at the output of A2. In essence, this voltage is zero from $T_0$ to $T_1$. From $T_1$ to $T_2$, the voltage increases to a level determined by the value of $R_{ref}$. From $T_2$ to $T_3$, the voltage decreases to zero.

The equations describing the operation of the invention are as follows:

$$\frac{R_{ref}}{R_x} = \frac{N_{ref}}{N_x} \quad (5)$$

which can be rewritten as:

$$G_x = \frac{N_{ref}}{R_{ref}N_x} = \frac{1}{R_x} \quad (6)$$

The controller 11, of course, controls the state of S1, S2 and S3. As discussed above, the preferred form of S1 S2 and S3 is semiconductor switches, as opposed to the mechanical switches illustrated. However, their functional operation is the same as the functional operation of the mechanical switches. Preferably, the counter 13 is free running. The counter counts clock pulses produced by the clock source 15 and may be preset to some value when an overflow pulse occurs. Some predetermined time period after S1 is closed, a second overflow pulse occurs and the controller opens S1 and closes S3 (time $T_1$). The next overflow pulse produced by the counter 15 causes the controller 11 to close S2 and open S3 (time $T_2$). S2 remains closed and S3 remains open until the output of A3 reaches a predetermined level (e.g., zero). When this occurs, the controller enables the latches 17. The latches 17 store the count value of the counter 15, and the stored value is applied to the display 19. The display 19 can set to display conductance or, if desired, the output of the data latches can be applied to a digital calculator that converts the conductance data into resistance data and the result used to control the display. Obviously, the counter and controller can operate in functionally different manners to achieve the same result. Thus, the foregoing description is to be taken as exemplary and not limiting.

As will be appreciated by those skilled in the art and others, when the resistance and conductance measurements of a particular $R_x$ are the same, which occurs when $R_x = R_{ref}$, $N_{ref}$ (the reading) is the same. As $R_x$ increases ($G_x$ decreases), the reading goes down, i.e., toward zero, since conductance as opposed to resistance is being measured. If resistance were being measured, the reading would rapidly go over range, whereas conductance readings stay in range. It has been found that by measuring conductance rather than resistance values at least 500 times higher can be made. That is, the invention can be used to accurately measure resistance values greater than 10,000 megohms.

It will be appreciated that the present invention can be combined with a resistance measuring system adapted to measure resistance values below 20 megohms. Such a composite system can be controlled such that resistances below 20 megohms are measured directly and resistances above 20 megohms are measured inversely in accordance with the invention. As a result, are inexpensive, extremely wide-range resistance measuring device will be provided. The device will be inexpensive because only the manner of operation of the controller is changed. And, this change is of a logic nature. In both methods of operation, one side of the unknown resistance will be connected to the low side (ground) of the analog-to-digital converter. Such a manner of connection helps to eliminate the pickup of undesired extraneous signals, which otherwise might cause a noisy reading to occur.

In summary, the invention is directed to determining resistance values by measuring conductance. Measurements are made by first applying a voltage related to the voltage drop across a reference resistance to a dual slope analog-to-digital converter for a known period of time, followed by the application of a voltage drop of inverse polarity taken across the unknown resistance for a measured period of time. The resultant time measurement, if appropriate referenced resistance and referenced timing values are chosen, is directly, integrally related to the conductance of the resistance whose value is to be determined and inversely related to the resistance value.

While a preferred embodiment of the invention has been illustrated and described, as will be appreciated by those skilled in the art and others, various changes can be made therein without departing from the spirit and scope of the invention. In this regard, while the invention has used a flying capacitor (C1) to store the voltage for use by the analog-to-digital converter, it is possible to modify this arrangement within the scope of the invention by placing the ground point at T1, rather than at T2, and eliminate R1. If this is done, C1 also can be eliminated and the voltage drop across $R_{ref}$ applied directly to A1 during the $T_1$-$T_2$ time period. However, this arrangement has certain disadvantages that offset the simplification advantages. Specifically, this arrangement results in voltage source floating and the disadvantages flowing therefrom. Moreover, such an arrangement is more difficult to protect should high voltages be inadvertently applied across T1 and T2. Thus, the preferred embodiment of the invention is one formed in the manner illustrated in FIG. 1 and described above. With respect to this embodiment, it should be noted that the value of R1 may be made equal to zero, if desired. Hence, within the scope of the appended claims, the invention can be practiced otherwise than as specifically described herein.

The embodiments of the invention in which an exclusive property or privilege is claimed are defined as follows:

1. A method of determining the resistance value of an unknown resistance by measuring the conductance of said unknown resistance comprising the steps of:

passing the same current through both a resistance of known value and said unknown resistance so as create a voltage drop across both said resistance of known value and said unknown resistance;

charging an integrating capacitor in accordance with the voltage drop across said resistance of known value for a known time period;

discharging said integrating capacitor in accordance with the voltage drop across said unknown resistance; and, measuring the time it takes for said integrating capacitor to discharge to a predetermined value from the charge level created when said capacitor is charged in accordance with the voltage drop across said known resistance for said known time period.

2. The method claimed in claim 1 comprising the additional step of applying a voltage related to the voltage drop across said resistance of known value to an input capacitor for a predetermined initial time period prior to said step of charging said integrating capacitor in accordance with the voltage drop across said resistance of known value for a known period of time, the voltage on said input capacitor created by applying said voltage related to said voltage drop across said resistance of known value during said initial time period forming the voltage used to charge said integrating capacitor.

3. The method claimed in claim 2 wherein said step of measuring the time it takes for said integrating capacitor to discharge to a predetermined level includes the substep of counting clock pulses during said time interval.

4. The method claimed in claim 3 including the step of displaying in numeric form data related to the number of clock pulses counted during said time interval.

5. A conductance measuring apparatus for determing the conductance value of an unknown resistance comprising:

(a) a reference resistance;
   (b) circuit means for connecting said reference resistance in series with said unknown resistance;
   (c) voltage means for applying an electrical voltage to said series circuit formed by said reference resistance and said unknown resistance such that a first voltage having a magnitude related to the resistance value of said reference resistance is developed across said reference resistance and a second voltage having a magnitude related to the resistance value of said unknown resistance is developed across said unknown resistance;
   (d) integrating means; and,
   (e) control and measuring means for:

(1) applying said first voltage to said integrating means for a known period of time;
   (2) applying said second voltage to said integrating means in opposite polarity to said first voltage at the end of said known period of time; and,
   (3) measuring a time period starting when said second voltage is applied to said integrating means and terminating when the output of said integrating means reaches a predetermined level, said measured time period being directly related to the conductance value of said unknown resistance.

6. The conductance measuring apparatus claimed in claim 5 wherein said control and measuring means includes:

first switching means for applying said first voltage to said integrating means; and,
   second switching means for applying said second voltage to said integrating means.

7. The conductance measuring apparatus claimed in claim 6 wherein said first switching means comprises:
   a capacitor;
   a first switch for connecting said capacitor in parallel with said reference resistor; and,
   a second switch for connecting said capacitor across the input of said integrating means.

8. The conductance measuring apparatus claimed in claim 7 wherein said integrating means includes an integrator formed of: an operational amplifier; a resistor having one end connected to receive the input voltage applied to said integrator and the other end applied to one input of said operational amplifier; and, a capacitor connected between said one input of said operational amplifier and the output of said operational amplifier.

9. The conductance measuring apparatus claimed in claim 8 wherein said integrating means also includes a comparator having one input connected to the output of said operational amplifier and a second input connected to a point of predetermined voltage magnitude.

10. The conductance measuring apparatus claimed in claim 9 wherein said control and measuring means also includes:

a source of clock pulses;
    a counter connected to said source of clock pulses so as to count pulses produced by said source of clock pulses, said counter having an overflow output and data outputs;
    a controller connected to the overflow output of said counter and to the output of said comparator for controlling said first and second switches of said first switch means, and said second switch means, such that said first switch is closed and said second switch and said second switch means are open for a first predetermined period of time, said second switch is closed and said first switch and said second switch means are open for a second period of time, and said second switch means is closed and said first and second switches are open for a third period of time, said third period of time starting when said counter overflows and terminating when the output of said comparator reaches a predetermined level; and,
    a display subsystem connected to the data outputs of said counter, said display subsystem connected to said controller so as to be enabled to display the output of said counter when the output of said comparator reaches said predetermined level.

11. A digital conductance measuring apparatus as claimed in claim 10 wherein said display subsystem comprises data latches having data inputs an enable input and data outputs, the data inputs of said data latches being connected to the data outputs of said counter and the enable input of said data latches being connected to a control output of said controller; and, a display connected to the data outputs of said data latches.

* * * * *

UNITED STATES PATENT AND TRADEMARK OFFICE
CERTIFICATE OF CORRECTION

PATENT NO. : 4,217,543

DATED : August 12, 1980

INVENTOR(S) : Norman H. Strong

It is certified that error appears in the above-identified patent and that said Letters Patent are hereby corrected as shown below:

Column 4, line 40, cancel "$fN_x$" and insert --$N_{ref}/f$--;

Column 4, line 41, cancel "$fN_{ref}$" and insert --$N_x/f$--; and,

Column 5, line 32, cancel "$N_x$" and insert --$N_{ref}$--.

Signed and Sealed this

Thirteenth Day of January 1981

[SEAL]

Attest:

SIDNEY A. DIAMOND

*Attesting Officer*  *Commissioner of Patents and Trademarks*